United States Patent [19]
Crispie et al.

[11] Patent Number: 5,329,187
[45] Date of Patent: Jul. 12, 1994

[54] HIGH SPEED DIFFERENTIAL COMPARATOR

[75] Inventors: Finbarr J. Crispie, Sunnyvale; Geert P. Rosseel, Stanford, both of Calif.

[73] Assignee: Harris Corporation, Melbourne, Fla.

[21] Appl. No.: 18,619

[22] Filed: Feb. 17, 1993

Related U.S. Application Data

[63] Continuation of Ser. No. 720,082, Jun. 24, 1991.

[51] Int. Cl.$^5$ .......................... H03K 5/24; H03K 3/02
[52] U.S. Cl. .................................. 307/494; 307/355; 307/491
[58] Field of Search ............... 307/355, 362, 356, 291, 307/494, 530, 359, 279, 491

[56] References Cited

U.S. PATENT DOCUMENTS

| | | | |
|---|---|---|---|
| 3,849,673 | 11/1974 | Koo | 307/530 |
| 4,162,539 | 7/1979 | Hebenstreit | 307/530 |
| 4,511,810 | 4/1985 | Yukawa | 307/530 |
| 4,604,534 | 8/1986 | Pricer | 307/530 |
| 4,965,468 | 10/1990 | Nicollini et al. | 307/530 |
| 5,032,744 | 7/1991 | Liu | 307/530 |

*Primary Examiner*—John Zazworsky
*Attorney, Agent, or Firm*—Henry I. Schanzer; C. C. Krawczyk; W. A. Troner

[57] ABSTRACT

This invention relates to a capacitive switching network for producing signals of opposite polarity. In one embodiment of the invention, a first signal (V1) is applied to the first plate of a first capacitor (C1) and a second signal (V2) is applied to the first plate of a second capacitor (C2). The first plates of the first and second capacitors are then shorted together to produce a combined voltage (Vc). The generation of Vc causes an AC voltage equal to (Vc−V1) to be produced at the second plate of C1 and an AC voltage equal to (Vc−V2) to be produced at the second plate of C2. By way of example, for C1 equal to C2, there is produced a Vc equal to (V1+V2)/2. Furthermore, if V1 is greater than V2, a negative going AC signal equal to (VC−V1) is produced at the second plate of C1, and a positive going AC signal equal to (Vc−V2) is produced at the second plate of C2. The capacitive network of the invention is highly suited for use in high speed differential comparators.

14 Claims, 1 Drawing Sheet

HIGH SPEED DIFFERENTIAL COMPARATOR

This is a continuation of application Ser. No. 720,082, filed Jun. 24, 1991.

FIELD OF THE INVENTION

The present invention relates to a differential comparator and, more particularly, to a differential comparator which operates at a high speed.

BACKGROUND OF THE INVENTION

A wide variety of applications arise where an unknown voltage must be compared to a standard voltage within certain preset voltage limits, or two separate voltages must be compared to determine, for example, which is the greater of the two. Such comparisons are used in, for example, feedback circuits, digital voltmeters, counters, etc.

Differential comparator circuits are commonly used for comparing or sensing the difference in levels (e.g., voltages) of a pair of input electrical signals. The differential comparator provides an indication of which of the two electrical input signal is larger.

U.S. Pat. No. 4,374,334 (W. E. Engler) which issued on Feb. 15, 1983 discloses a comparator comprising a first surface charge transistor and a second surface charge transistor which are provided in a common substrate. During a first phase of a cycle of operation, a first voltage signal is applied to a transfer gate of the first transistor and a second voltage signal is applied to a transfer gate of the second transistor. Additionally, during the first phase, the source region and the transfer gate of each of the transistors are equilibrated. The receiver regions or nodes of each of the transistors are precharged and then floated or isolated. During a second phase of the cycle of operation, the first voltage signal is applied to the transfer gate of the second transistor and the second voltage signal is applied to the transfer gate of the first transistor. Additionally, during the second phase, the receiver nodes accumulate an amount of charge proportional to the change of voltage resulting from the switching of the input signals. Such charge is received, however, only if a transfer gate becomes more positive (for n-channel transistors). The receiver node associated with the more positive signal in the first phase of operation will, therefore, remain charged while the receiver node associated with the more negative signal will be discharged, by transfer of charge, to ground. The extent of the potential change is proportional to the difference between the two voltage signals and the gain of the surface charge transistors.

A differential voltage comparator is disclosed in the book entitled "Electronic Circuit Design Handbook" by the editors of EEE magazine, published by Tab Books, revised 4th Edition, 1971, at pages 135 to 136. The disclosed differential voltage comparator provides a "go-no-go" indication when two input signals are compared. If the two input signals are within a preset differential voltage, then an output relay is not actuated and a "go" indication is provided. However, when the two input signals differ by more than the preset differential voltage, then the output relay is actuated and a "no-go" indication is provided.

The prior art differential comparator described hereinabove includes many transistors, diodes, resistors, thermal resistors, and a relay and, therefore, is a complicated circuit. Accordingly, it is desirable to have a comparator which operates at relatively high speeds and has relatively few components.

SUMMARY OF THE INVENTION

The present invention is directed to differential comparators which operate at a high speed to provide an output indication of which of two input signals has a greater amplitude. More particularly, in a first embodiment, the differential comparator comprises first and second input terminals for receiving first and second input signals, respectively, to be compared, a first and a second amplifier, a feedback network, first and second capacitors, and switching means. Each of the first and second amplifiers includes an input and an output which forms a separate output of the differential comparator. The feedback network capacitively couples the output of the first and the second amplifier to the input of the second and the first amplifier, respectively. Each of the first and second capacitors couples the first and second input terminals, respectively, of the differential comparator to the input of the respective first and second amplifiers. During a first phase of operation, the switching means functions to permit each of the first and second amplifiers to be precharged to a separate predetermined voltage level value, and concurrently deliver the first and second input signals to the first and second capacitors, respectively. During a second phase of operation, the switching means isolates the first and second input terminals from the first and second capacitors, places a short across first terminals of the first and second capacitors, and releases the first and second amplifiers from their precharged state to provide an indication of which input signal has a greater amplitude.

In a second embodiment, which is an extension of the first embodiment, the switching means also selectively isolates the first and second capacitors from the input of each of the first and second amplifiers at a predetermined period of time during the second phase of operation when a latching of the first and second amplifiers has begun. This removes the load of the first and second capacitors from the inputs of the first and second amplifiers and thus allows a speed up of the regenerative action of the two amplifiers and a generation of an indication at the outputs of the differential comparator of which of the first and second input signals has a greater amplitude.

The present invention is further directed to a combination comprising first and second capacitors each having first and second plates. Additionally, the combination comprises first selective applying means for selectively applying a first signal to the first plate of the first capacitor, and second selective applying means for selectively applying a second signal to the first plate of the second capacitor. First placing means are provided for placing a first D.C. voltage level on the second plate of the first capacitor and a second D.C voltage level on the second plate of the second capacitor. Second placing means are provided for selectively shorting the first plates of the first and second capacitors together for producing A.C. signals of opposite polarity at the second plates of the first and second capacitors.

The present invention is further directed to a method of providing a differential comparison between a first and a second input signal comprising the following steps. In a first step during a first phase of operation, an input and an output of each of first and second amplifiers are precharged to a predetermined value, and differential values between the first and second input signals and the precharged values of the inputs of the first and second amplifiers, respectively, are stored in respective first and second capacitors. In a second step occurring during the first phase of operation concurrently with the first step, any voltage differential between the precharged value of the output of the first and second amplifiers and the input of the second and first amplifiers, respectively, is stored in a respective third and fourth capacitor of a feedback network. In a third step during a second phase of operation, the first and second amplifiers are released from their precharged state while the first and second capacitors are isolated from receiving the first and second input signals, respectively. In a fourth step occurring concurrently with the third step, a short circuit is placed across input sides of the first and second capacitors where these capacitors receive the first and second input signals. As a result, output signals are generated at the outputs of the first and second amplifiers which indicates which of the two input signals has a greater amplitude.

In a second embodiment of the above-described method, after performing the third and fourth steps, the first and second capacitors are isolated from the inputs of the first and second amplifiers, respectively, at a predetermined period of time when a latching of the first and second amplifiers begins.

The invention will be better understood from the following more detailed description taken with the accompanying drawings and claims.

DETAILED DESCRIPTION

Figure 1:
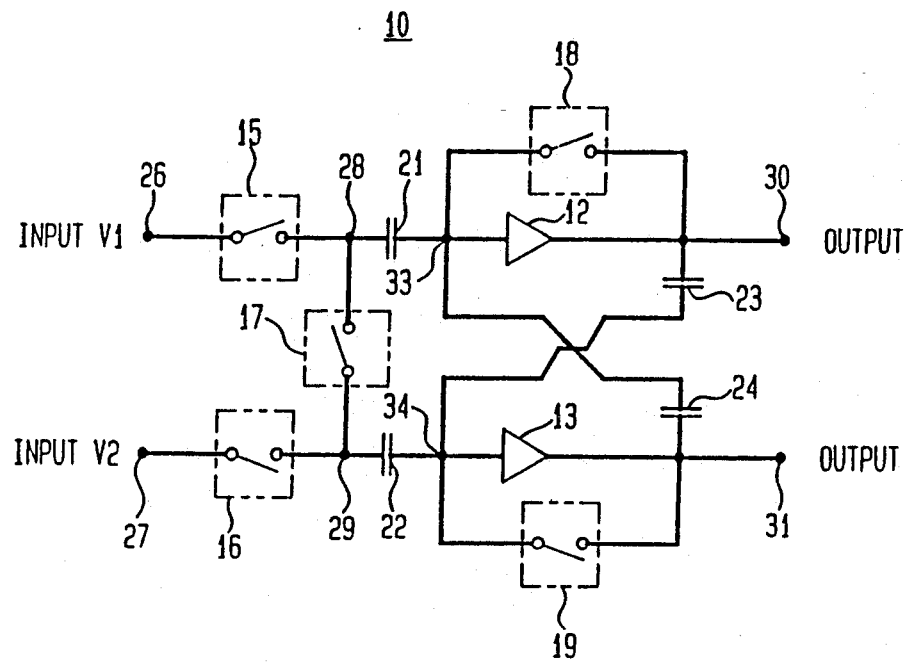
FIG. 1 is a circuit diagram of a differential comparator in accordance with the present invention.

Referring now to FIG. 1, there is shown a circuit diagram of a differential comparator 10 in accordance with the present invention. Differential comparator 10 comprises first and second amplifiers 12 and 13; five switches (gating means) 15, 16, 17, 18 and 19 (each shown within a dashed line box); four capacitors 21, 22, 23, and 24; first and second input terminals 26 and 27; and first and second output terminals 30 and 31. For purposes of discussion hereinafter, the amplifiers 12 and 13 are referred to as inverters 12 and 13 because they act to produce a negative going output signal for a positive going input signal.

More particularly, the first and input terminals 26 and 27 are arranged to receive first and second input signals, respectively, which are to be compared by comparator 10. Input terminal 26 is coupled to a first terminal of switch 15, and input terminal 27 is coupled to a first terminal of switch 16. A second terminal of switch 15 is coupled to a first terminal of capacitor 21 and to a node 28. A second terminal of switch 16 is coupled to a first terminal of capacitor 22 and to a node 29. A second terminal of capacitor 21 is coupled to a node 33, to an input of inverter 12, to a first terminal of switch 18, and to a first terminal of the capacitor 24. A second terminal of capacitor 22 is coupled to a node 34, to an input of inverter 13, to a first terminal of switch 19, and to a first terminal of the capacitor 23. First and second terminals of the switch 17 are coupled to nodes 28 and 29, respectively. When switch 17 is closed, it acts as a short between nodes 28 and 29. The output of inverter 12 is coupled to a second terminals of capacitor 23 and switch 18, and to the first output terminal 30. The output of inverter 13 is coupled to a second terminals of the capacitor 24 and switch 19, and to the second output terminal 31. Capacitor 23 serves as a feedback path from output terminal 30 to input node 34, and capacitor 24 serves as a feedback path from output terminal 31 to node 33.

In operation, it is assumed hereinafter that voltages V1 and V2 are concurrently received at input terminals 26 and 27, respectively, for purposes of comparison by differential comparator 10. The switches are shown schematically with first and second terminals and a movable arm (no reference number given) which selectively shorts (couples) the first and second terminals. There are two phases in the operation of differential comparator 10. The switches 15, 16, 18 and 19 are driven by one phase of a clock signal (not shown) while switch 17 is driven by another phase of the clock signal. During a first phase, switches 15, 16, 18 and 19 are closed (conducting) and switch 17 is open (non-conducting). Therefore, V1 and V2 are provided via switches 15 and 16, respectively, to the input side of respective capacitors 21 and 22. With the switches 18 and 19 across inverters 12 and 13, respectively, closed, the inverters go into what is known as an "auto-zero phase" where each of inverters 12 and 13 is precharged (the output voltage of an inverter is equal to its input voltage). It is to be understood that the input and output of each of the inverters 12 and 13 are placed at their own precharged value during the "auto-zero phase" period, which value may or may not be zero. As a result the voltage across capacitor 21 is the voltage difference between the input voltage V1 and whatever voltage is found at the input of inverter 12 (the precharged value). Similarly, the voltage across capacitor 22 is the difference between the input voltage V2 and whatever voltage is found at the input of inverter 13 (the precharged value). Any difference between the precharged values of inverters 12 and 13 are stored on the capacitors 23 and 24.

During a second phase, switches 15, 16, 18 and 19 are opened, and switch 17 is closed. With switch 17 closed and switches 15 and 16 open, the voltages at nodes 28 and 29 are forced to a particular voltage because of the short formed by switch 17. Because of the capacitive coupling (capacitors 21 and 22) between the inputs of inverters 12 and 13 and nodes 28 and 29, respectively, nodes 33 and 34 (the inputs of the inverters) are also forced to change. Because the voltages at nodes 28 and 29 move in opposite directions in order to converge to the same voltage (one node increases in voltage while the other node decreases in voltage), the voltages at the inputs to the inverters 12 and 13 move in opposite directions. More particularly, with switch 17 closed, the voltage on the left-hand side of capacitors 21 and 22 equalize to a value between V1 and V2. For example, if the input and output of the inverters 12 and 13 are nominally at zero volts, there is a zero difference between the two inverters. With switch 17 closed, the voltage at the left-hand side of capacitors 21 and 22 equalize to substantially (V1+V2)/2. Such changes in voltage on the left-hand Of capacitors 21 and 22 cause a differential voltage to occur on the right-hand side of capacitors 21 and 22. The differential voltage on the right-hand side of capacitors 21 and 22 is dependent on whether V1 is greater than V2, or vice versa, and the voltage differential between V1 and V2. With switches 18 and 19 open, the inverters 12 and 13 are no longer at the precharged input and are in their amplifying mode. As a result of the voltage differential occurring at the inputs of inverters 12 and 13, the voltages at the output of the inverters diverge.

More particularly, in the second phase with a difference between V1 and V2, the voltage on the left-hand side (nodes 28, 29) of one of the capacitors 21 and 22 decreases, and the voltage on the left-hand side of the other capacitor increases. This causes the right-hand side (nodes 33, 34) of one of the capacitors 21 and 22 to decrease while the right-hand side of the other capacitor increases. Such changes at the right-hand sides of capacitors 21 and 22 cause a differential voltage to occur at the inputs of inverters 12 and 13. In other words, assuming that V1 is greater than V2, then during phase two, the voltages of nodes 28 and 33 decrease while the voltages of nodes 29 and 34 increase to cause a voltage differential to occur between the outputs thereof. The decreasing signal at node 33 is received at the input of the inverter 12, and causes the output of the inverter 12 to increase from its precharged value. Similarly, the increasing signal at node 34 is received at the input of the inverter 13, and causes the output of the inverter 13 to decrease from its precharged value.

An increasing signal at the output of inverter 12 is transmitted through the feedback capacitor 23 to the input of inverter 13. Since the input to inverter 13 is already increasing because of the increasing signal from node 29 coupled through capacitor 22, the increasing feedback signal from the output of inverter 12 through capacitor 23 causes the input of inverter 13 to increase even further. Similarly, since the input to inverter 12 is already decreasing because of the decreasing signal from node 28 coupled through capacitor 21, the decreasing feedback signal from the output of inverter 13 through capacitor 24 causes the input of inverter 12 to decrease even further. The purpose of feedback capacitors 23 and 24 is to provide a feedback mechanism which can also properly balance the inverters 12 and 13 if there is a difference between their pre-charged voltage values. For example, if it is expected that an inverter is set to a value of 2.5 volts, then in the balanced condition the inputs and outputs of both of the inverters 12 and 13 are at o 2.5 volts during the "auto-zero phase". However, if there is an offset where, for example, the output of inverter 12 is at 2.3 volts and the output of inverter 13 is at 2.6 volts, then without capacitors 23 and 24 an imbalance exists. The purpose of capacitors 23 and 24 is to store such voltage differential.

An important aspect of the invention is that capacitor 23 functions to decouple the D.C. voltage level at the output of inverter 12 from the input to inverter 13, and capacitor 24 decouples the D.C. voltage level at the output of inverter 13 from the input of inverter 12. The significance of this is that if there is a difference in these D.C. voltage levels, it does not affect the operation of the inverters 12 and 13.

In a preferred embodiment, during the "auto-zero phase", the outputs of the inverters 12 and 13 are normally set at the midpoint of 0 to 5 volts, which is 2.5 volts. During the second phase of operation, the outputs of the inverters 12 and 13 swing apart, with the output of one inverter going to 5 volts and the output of the other inverter going to zero volts. For the exemplary case where V1 is larger than V2, the output of inverter 12 would rise to 5 volts and the output of inverter 13 would drop to zero volts. Similarly, if V2 is larger than V1, then the output of inverter 13 would rise to 5 volts and the output of inverter 12 would drop to zero volts. Therefore, differential comparator 10 detects whether V1 is larger than V2 or vice versa. A disadvantage of differential comparator 10 is that capacitors 21 and 22 slow down the latching time of the cross-coupled inverters 12 and 13.

Figure 2:
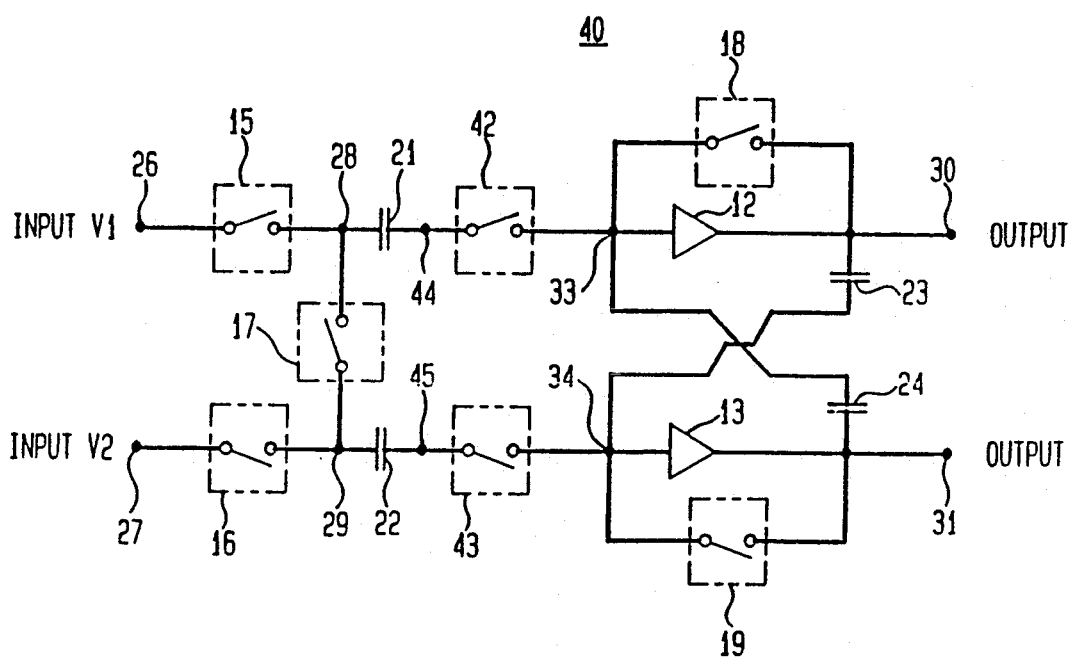
FIG. 2 is a circuit diagram of a differential comparator in accordance with the present invention which improves the speed of the circuit of FIG. 1.

Referring now to FIG. 2, there is shown a circuit diagram of a differential comparator 40 in accordance with the present invention which improves the speed of the circuit of FIG. 1. Components of the differential comparator 40 of FIG. 2 which correspond to the components of differential comparator 10 of FIG. 1 and function in the same manner are given the same reference designations. Differential comparator 40 comprises first and second amplifiers 12 and 13; seven switches (gating means) 15, 16, 17, 18, 19, 42 and 43; four capacitors 21, 22, 23, and 24; a first and second input terminal 26 and 27; and first and second output terminals 30 and 31. Differential comparator 40 is essentially the same as differential comparator 10 except for the addition of switches 42 and 43 and nodes 44 and 45. A first terminal of switch 42 is coupled to the second terminal of capacitor 21 and to a node 44. A second terminal of switch 42 is coupled to node 33, to an input of inverter 12, to a first terminal of switch 18, and to a first terminal of the capacitor 24. A first terminal of switch 43 is coupled to the second terminal of capacitor 22 and to a node 45. A second terminal of switch 43 is coupled to node 34, to an input of inverter 13, to a first terminal of switch 19, and to a first terminal of the capacitor 23. In operation, the switches 42 and 43 are driven by an extra clock signal (not shown) which preferably is part of a second phase.

During a first phase, the switches 15, 16, 18, 19, 42 and 43 are closed (conducting) and switch 17 is open (not conducting) to place the inverters 12 and 13 into the precharged state as described hereinbefore for differential comparator 10. At the beginning of a second phase, the switches 15, 16, 18 and 19 are opened and switch 17 is closed while switches 42 and 43 remain closed. Then, shortly after the second phase has started and at the period where the feedback circuit of capacitors 23 and 24 has started to latch the inverters 12 and 13, the switches 42 and 43 are opened. The opening of switches 42 and 43 remove the capacitors 21 and 22 from influencing the latching of inverters 12 and 13 and thereby speed the operation of the differential comparator 40. More particularly, the output of one of the inverters 12 or 13 is increasing and is sending a signal through its feedback capacitor 23 or 24 to the input of the other inverter. Capacitors 21 and 22 create a loading effect on the input nodes 28 and 29 because the outputs of the inverters 12 and 13 are trying to drive the input nodes 28 and 29 through the capacitors 23 and 24. By removing the capacitors 21 and 22 from the inputs of the inverters 12 and 13, the inputs of the inverters converge, or change, more quickly. Therefore, switches 42 and 43 remain closed for a short period of time until the latching process of the inverters 12 and 13 is started, and then the switches 42 and 43 are opened to remove the load. In a preferred embodiment of FIGS. 1 and 2, inverters 12 and 13 are CMOS amplifiers, the capacitors 21, 22, 23, and 24 are each, for example, 0.1 picofarads, and switches 15, 16, 18, 19, 42 and 43 are n-channel Metal Oxide Semiconductor (MOS) transistors. With switch 15 being an N-channel MOS transistor, the first terminal is the drain, the second terminal is the source, and the control device, which effectively opens and closes the transistor, is the gate.

Advantages of the differential comparator 40 over conventional comparators are as follows. First, the comparator 40 is very fast because the capacitively coupled feedback loop produces a very short latching time. Second, the comparator 40 is insensitive to noise injected from the switches because the fully differential technique allows a very high rejection of switching noise since only differential signals are important. Third, the comparator 40 has a high supply voltage rejection ratio since the fully differential technique allows for a very high rejection of changes in the supply voltage. Fourth, the differential comparator 40 has very good offset cancellation since the use of the capacitors 23 and 24 in the feedback network minimizes the effect of offset differences between the two inverters 12 and 13. Fifth, there is very little charge injection from inverters 12 and 13 into the signal sources connected to terminals 26 and 27 during switching because the use of the switches 42 and 43 isolates the inputs form the large voltage swing at nodes 33 and 34 which reduces transient current spikes at the input. Sixth, the differential comparator 40 can be laid out in an area small enough to be competitive with conventional comparator designs.

A method of providing a differential comparison between a first and second input signal in the hereinbefore described differential comparators 10 and 40 is a follows. In a first step, an input and output of each of a first and a second amplifiers are precharged to a predetermined values during a first phase of operation. Simultaneous therewith during the first step, differential values between the first and second input signals and the precharged values of the inputs of the first and second amplifiers, respectively, are stored in respective first and second capacitors. In a second step occurring simultaneous with the first step during the first phase of operation, any voltage differential between the precharged value of the output of the first and second amplifiers and the input of the second and first amplifiers, respectively, is stored in a respective third and fourth capacitor of a feedback network. In a third step during a second phase of operation, the first and second amplifiers are released from their precharged state while the first and second capacitors are isolated from receiving the first and second input signals, respectively. In a fourth step occurring simultaneously with the third step, a short circuit is placed across input sides of the first and second capacitors where these capacitors receive the first and second input signals. As a result of the above-described four steps, an indication of which of the first and second input signals has a greater amplitude is generated at the outputs of the first and second amplifiers.

To increase the speed of a latching process of the first and second amplifiers, as shown in differential comparator 40, the following step is added to the above-described four steps. After performing the third and fourth steps, the first and second capacitors are isolated from the inputs of the first and second amplifiers, respectively, at a predetermined period of time when a latching of the first and second amplifiers has begun.

An alternative explanation of the invention as shown in FIGS. i and 2 is that there is a first amplifier 12 and a second amplifier 13. Each of the amplifiers 12 and 13 has a means (switches 18 and 19) which is used to "auto-zero" the respective amplifier. By auto-zeroing each amplifier, the input and output of the amplifier is set at the operating point of that amplifier. As a result, the input and the output of first amplifier 12 is set to a potential defined as $V_{01}$, and the right-hand (output) side of capacitor 21 is charged to $V_{01}$. Similarly, the input and output of the second amplifier 13 is set to a potential defined as $V_{02}$, and the right-hand (output) side of capacitor 22 is charged to $V_{02}$. The capacitors 23 and 24 in the feedback paths between amplifiers 12 and 13 function to decouple the D.C. levels between the output of one amplifier and the input of the other amplifier while providing an A-C coupling path therebetween. Concurrent therewith, the input potentials $V_1$ and $V_2$ are used to charge the left-hand (input) side of capacitors 21 and 22, respectively. Therefore, the left-hand (input) side of capacitor 21 is charged to a potential $V_1$, and the right-hand (output) side of capacitor 21 is charged to a "auto-zero" potential $V_{01}$. The purpose for auto-zeroing amplifiers 12 and 13 is to set each amplifier at its maximum gain point. In other words, each amplifier is biased at the point at which that amplifier is going to start conducting the most (has the highest gain).

Amplifiers 12 and 13 are typically complementary inverters. If the complementary inverters 12 and 13 are each operated, for example, across a 5 V battery and transistors (not shown) of the inverters 12 and 13 are matched, then when "auto-zeroing" (connect the input to the output) the inverters, their resting points would be 2.5 volts. Typically there is some mismatch between the transistors of the inverters 12 and 13, so, for example, one inverter is auto-zeroed at 2.6 volts and the other inverter is auto-zeroed at 2.3 volts. Although such difference in auto-zeroed values is stored in the capacitors 23 and 24, it is important to understand that capacitor 23 is de-coupling the D.C. voltage level at the output of amplifier 12 from the D.C. voltage level at the input of amplifier 13. Similarly, capacitor 24 decouples the D.C. voltage level at the output of amplifier 13 from the D.C. voltage level at the input of amplifier 12. The fact that a mismatch exists does not affect the operation of the comparator 10 of FIGS. 1 and 2. Each of inverters 12 and 13 gets biased to its optimum auto-zero bias point (operating point), and the fact that the bias point of one inverter is not the same as the bias point of the other inverter is not significant because one inverter does not load down the other inverter in a D.C. sense.

Additionally, with inverters 12 and 13 auto-zeroed to different D.C. voltage levels, the right-hand (output) side of capacitors 21 and 22 are at different D.C. levels. The fact that the output side of the capacitors 21 and 22 are at different D.C. voltage levels will not affect the operation of the comparison sensing of the two input voltages $V_1$ and $V_2$ by the network of amplifiers 12 and 13. In operation, when switch 17 is closed in the second phase of operation, $V_1$ and $V_2$ will come to one value. If $V_1$ is greater than $V_2$, then a step down in voltage occurs on the right-hand (output) side of capacitor 21 and a step up in voltage occurs on the right-hand side of capacitor 22. The A-C signal developed on the right-hand side of capacitor 21 would be very close but opposite to the polarity of the signal developed at the right-hand side of capacitor 22. These step down and step up in voltages are applied in an A-C sense to the inverters 12 and 13, respectively. Therefore, the fact that there are different initial D.C. operating levels at the inverters 12 and 13 does not affect the operation of the comparator 10.

It is to be appreciated and understood that the specific embodiments of the invention are merely illustrative of the general principles of the invention. Various modifications may be made consistent with the principles set forth hereinbefore. For example, the inverters (amplifiers) 12 and 13 can be implemented using single interconnected or integrated bipolar devices, n-channel MOS devices, p-channel MOS devices, CMOS devices, a combination of bipolar and CMOS devices, or other combinations of devices. These devices can be implemented in silicon or GaAs or other semiconductor materials. Additionally, the inverters 12 and 13 can be implemented as separate inverters or in an integrated manner such as by using a differential pair configuration.

What is claimed is:

1. A combination comprising:
   first and second capacitors each having first and second plates;
   means for selectively applying a first signal (V1) to the first plate of the first capacitor;
   means for selectively applying second signal (V2) to the first plate of the second capacitor;
   means for placing a first D.C. voltage level on the second plate of the first capacitor and a second D.C. voltage level on the second plate of the second capacitor; and
   means for selectively shorting the first plates of the first and second capacitors together for combining said V1 and said V2 and producing a combined voltage (Vc) at the first plates of said first and second capacitors which has a value between V1 and V2, when V1 and V2 have different values, and for producing a voltage (Vc−V1) at the second plate of the first capacitor and a voltage (Vc−V2) at the second plate of the second capacitor, thereby producing A.C. signals of opposite polarity at the second plates of the first and second capacitors.

2. The combination of claim 1 wherein said means for placing a first D.C. voltage level and a second D.C. voltage level on the second plates of said first and second capacitors includes:
   first and second amplifying means, each amplifying means having an input and an output;
   selective coupling means for selectively coupling the input and output of each of the first and second amplifying means for auto-zeroing each amplifying means, the input of the first and second amplifying means being coupled to the second plate of the first and second capacitors, respectively;
   a third capacitor connected between the output of the first amplifying means and the input of the second amplifying means; and
   a fourth capacitor connected between the output of the second amplifying means and the input of the first amplifying means.

3. The combination of claim 2 wherein:
   the first and second capacitors receive the first and second signals, respectively, concurrent with the first and second amplifying means being auto-zeroed; and
   the selective shorting means shorts the first plates of the first and second capacitors together after the first and second amplifying means are auto-zeroed.

4. The combination as claimed in claim 1, wherein said means for selectively shorting the first plates of the first and second capacitors together includes solely a single selectively enabled switch directly connecting the first plates of the first and second capacitors.

5. The combination as claimed in claim 1, wherein said means for selectively applying a first signal (V1) to the first plate of the first capacitor includes a first input terminal adapted to receive a first signal (V1) and a first switch means connected between said first input terminal and the first plate of said first capacitor; and
   wherein said means for selectively applying a second signal (V2) to the first plate of the second capacitor includes a second input terminal adapted to receive a second signal (V2) and a second switch means connected between said second input terminal and the first plate of said second capacitor.

6. A differential comparator comprising:
   first and second input terminals for the application thereto of first (V1) and second (V2) input signals to be compared;
   first and second capacitors, each capacitor having a first and a second plate;
   a selectively enabled first switch means connected between said first input terminal and the first plate of said first capacitor;
   a selectively enabled second switch means connected between said second input terminal and the first plate of said second capacitor;
   a first amplifier with a first input, a first output, and a first autozeroing subcircuit coupling said first output to said first input when said first subcircuit is active;
   a second amplifier with a second input, a second output, and a second autozeroing subcircuit coupling said second output to said second input when said second subcircuit is active;
   means direct current connecting the first input of said first amplifier to the second plate of said first capacitor;
   means direct current connecting the second input of said second amplifier to the second plate of said second capacitor; and
   first and second feedback connectors, said first feedback connector being directly and permanently connected between said first output and said second input, and said second feedback connector being directly and permanently connected between said second output and said first input;
   whereby a differential signal at said first and second inputs is latched by said amplifiers when said first and second subcircuits change from active to inactive.

7. The differential amplifier as claimed in claim 6 further including:
   a selectively enabled third switch means connected between the first plate of the first capacitor and the first plate of the second capacitor; and
   means coupled to said first, second, and third selectively enabled switch means for enabling said first and second switch means and disabling said third switch means during a first time interval; and for disabling said first and second switch means and enabling said third switch during a second time interval;
   said third switch means when enabled for combining said first signal (V1) at said first plate of said first capacitor and said second signal (V2) at said first plate of said second capacitor and producing a combined voltage (Vc) at the first plate of said first and second capacitor which has a value between V1 and V2, when V1 and V2 have different values, and for producing a voltage (Vc−V1) at the second plate of the first capacitor and a voltage (Vc−V2) at the second plate of the second capacitor, thereby producing A.C. signals of opposite polarity at the second plates of the first and second capacitors.

8. A differential comparator of claim 7, whereby said first and second amplifiers latch a difference signal at said first and second signal terminals during a first phase (i) in that said switching circuitry connects said first signal terminal to said first capacitor and connects said second signal terminal to said second capacitor, and said first and second subcircuits are active, whereas during a second phase (ii) said switching circuitry isolates said first signal terminal from said first capacitor, isolates said second signal terminal from said second capacitor, and connects said first and second capacitors together, and said first and second subcircuits are inactive.

9. The differential comparator of claim 8, wherein: each of said first and second subcircuits is a switch; each of said first and second amplifiers is an inverter; each of said first and second feedback connectors is a capacitor;
said first and second capacitors each ash an input plate and an output plate; and
said switching circuitry includes a first switch between said first signal terminal and said input plate of said first capacitor, a second switch between said second signal terminal and said input plate of said second capacitor, a third switch between said input plates, a fourth switch between said output plate of said first capacitor and said first input, and a fifth switch between said output plate of said second capacitor and said second input;
whereby said fourth and fifth switches may be opened during said second phase to reduce the loading of said first and second amplifiers.

10. A differential comparator comprising:
first and second input terminals for the application thereto of first (V1) and second (V2) input signals to be compared;
first and second capacitors, each capacitor having a first and a second plate;
a selectively enabled first switch means connected between said first input terminal and the first plate of said first capacitor;
a selectively enabled second switch means connected between said second input terminal and the first plate of said second capacitor;
a first amplifier with a first input, a first output, and a first autozeroing subcircuit coupling said first output to said first input when said first subcircuit is active;
a second amplifier with a second input, a second output, and a second autozeroing subcircuit coupling said second output to said second input when said second subcircuit is active;
means direct current connecting the first input of said first amplifier to the second plate of said first capacitor;
means direct current connecting the second input of said second amplifier to the second plate of said second capacitor; and
first and second passive feedback networks, said first feedback network coupling said first output to said second input, and said second feedback network coupling said second output to said first input;
whereby a differential signal at said first and second inputs is latched by said amplifiers when said first and second subcircuits change from active to inactive;
a selectively enabled third switch means connected between the first plate of the first capacitor and the first plate of the second capacitor; and
means coupled to said first, second, and third selectively enabled switch means for enabling said first and second switch means and disabling said third switch means during a first time internal; and for disabling said first and second switch means and enabling said third switch during a second time interval,
said third switch means when enabled for combining said first signal (V1) at said first plate of said first capacitor and said second signal (V2) at said first plate of said second capacitor and producing a combined voltage (Vc) at the first plate of said first and second capacitor which has a value between V1 and V2, when V1 and V2 have different values, and for producing a voltage (Vc−V1) at the second plate of the first capacitor and a voltage (Vc−V2) at the second plate of the second capacitor, thereby producing A.C. signals of opposite polarity at the second plates of the first and second capacitors.

11. The comparator of claim 10, wherein:
said first passive feedback network is a capacitor;
said second passive feedback network is a capacitor;
said first amplifier is an inverter; and
said second amplifier is an inverter.

12. The differential comparator of claim 11, wherein:
each of said first and second subcircuits is a switch;
each of said first and second amplifiers is an inverter; and
each of said first and second passive feedback networks is a capacitor.

13. A combination comprising:
first and second capacitors each having first and second plates;
first switch means for selectively applying a first signal (V1) to the first plate of the first capacitor during a first time interval;
second switch means for selectively applying a second signal (V2) to the first plate of the second capacitor during said first time interval;
means for placing a first D.C. voltage level on the second plate of the first capacitor and a second D.C. voltage level on the second plate of the second capacitor; and
third switch means for selectively shorting the first plates of the first and second capacitors together during a second time interval, subsequent to said first time interval, for combining V1 and V2 and producing a combined voltage (Vc) at the first plate of said first and second capacitor which has a value between V1 and V2, when V1 and V2 have different values, and for producing a voltage (Vc−V1) at the second plate of the first capacitor and a voltage (Vc−V2) at the second plate of the second capacitor, thereby producing A.C. signals of opposite polarity at the second plates of the first and second capacitors.

14. The combination of claim 13, wherein said means for placing a first D.C. voltage level and a second D.C. voltage level on the second plates of said first and second capacitors includes:

first and second amplifying means, each amplifying means having an input and an output;

selective coupling means for selectively coupling the input and output of each of the first and second amplifying means for auto-zeroing each amplifying means, the input of the first and second amplifying means being coupled to the second plate of the first and second capacitors, respectively;

a third capacitor connected between the output of the first amplifying means and the input of the second amplifying means; and a fourth capacitor connected between the output of the second amplifying means and the input of the first amplifying means.

* * * * *